(12) United States Patent
Thompson

(10) Patent No.: US 7,567,132 B2
(45) Date of Patent: Jul. 28, 2009

(54) SYNTHESIZER

(75) Inventor: Ian V. Thompson, Christchurch (NZ)

(73) Assignee: Nokia Corporation, Espoo (FI)

( * ) Notice: Subject to any disclaimer, the term of this patent is extended or adjusted under 35 U.S.C. 154(b) by 535 days.

(21) Appl. No.: 10/503,661

(22) PCT Filed: Feb. 6, 2003

(86) PCT No.: PCT/IB03/00417
§ 371 (c)(1),
(2), (4) Date: Sep. 7, 2004

(87) PCT Pub. No.: WO03/067762
PCT Pub. Date: Aug. 14, 2003

(65) Prior Publication Data
US 2005/0095992 A1    May 5, 2005

(30) Foreign Application Priority Data
Feb. 7, 2002    (GB) .................... 0202884.3

(51) Int. Cl.
*H03L 7/00*    (2006.01)

(52) U.S. Cl. .................. 331/16; 331/1 A; 331/17; 331/34; 331/177 R; 327/156

(58) Field of Classification Search .................. 331/16, 331/17, 34, 1 A, 177 R; 327/156
See application file for complete search history.

(56) References Cited

U.S. PATENT DOCUMENTS

| 6,094,101 A | 7/2000 | Sander et al. ............... 331/17 |
| 6,658,237 B1* | 12/2003 | Rozenblit et al. ............ 455/83 |
| 6,661,293 B2* | 12/2003 | Paananen ..................... 331/10 |
| 7,091,759 B2* | 8/2006 | Sowlati et al. .............. 327/157 |

FOREIGN PATENT DOCUMENTS

| EP | 0 360 442 A1 | 3/1990 |
| WO | WO 00/14882 | 3/2000 |
| WO | WO 01/86814 A1 | 11/2001 |

* cited by examiner

*Primary Examiner*—Arnold Kinkead
(74) *Attorney, Agent, or Firm*—Harrington & Smith, PC (57) ABSTRACT

A synthesizer comprises a detector for detecting a parameter difference, a voltage controlled oscillator, at least one capacitor having one end connected to a node between the detector and the voltage controlled oscillator and means connected to an other end of the at least one capacitor for providing an electrical response in dependence on the detected parameter difference.

35 Claims, 7 Drawing Sheets

FIG. 1

Known Type Of Synthesiser

SYNTHESIZER

FIELD OF THE INVENTION

The present invention relates to a synthesizer and in particular, but not exclusively, to a synthesizer using a phase or frequency locked loop. Synthesizers embodying the present invention may be used in elements of a cellular telecommunications network.

BACKGROUND OF THE INVENTION

Synthesizers are used to generate signals of a given frequency. This frequency signal is often mixed with the received signal to convert the received signal to an intermediate frequency or mixed with the signal to be transmitted to convert that signal to an intermediate frequency, in wireless telecommunication applications. However, it should be appreciated that synthesizers are not limited to application in the telecommunication field.

Figure 1:
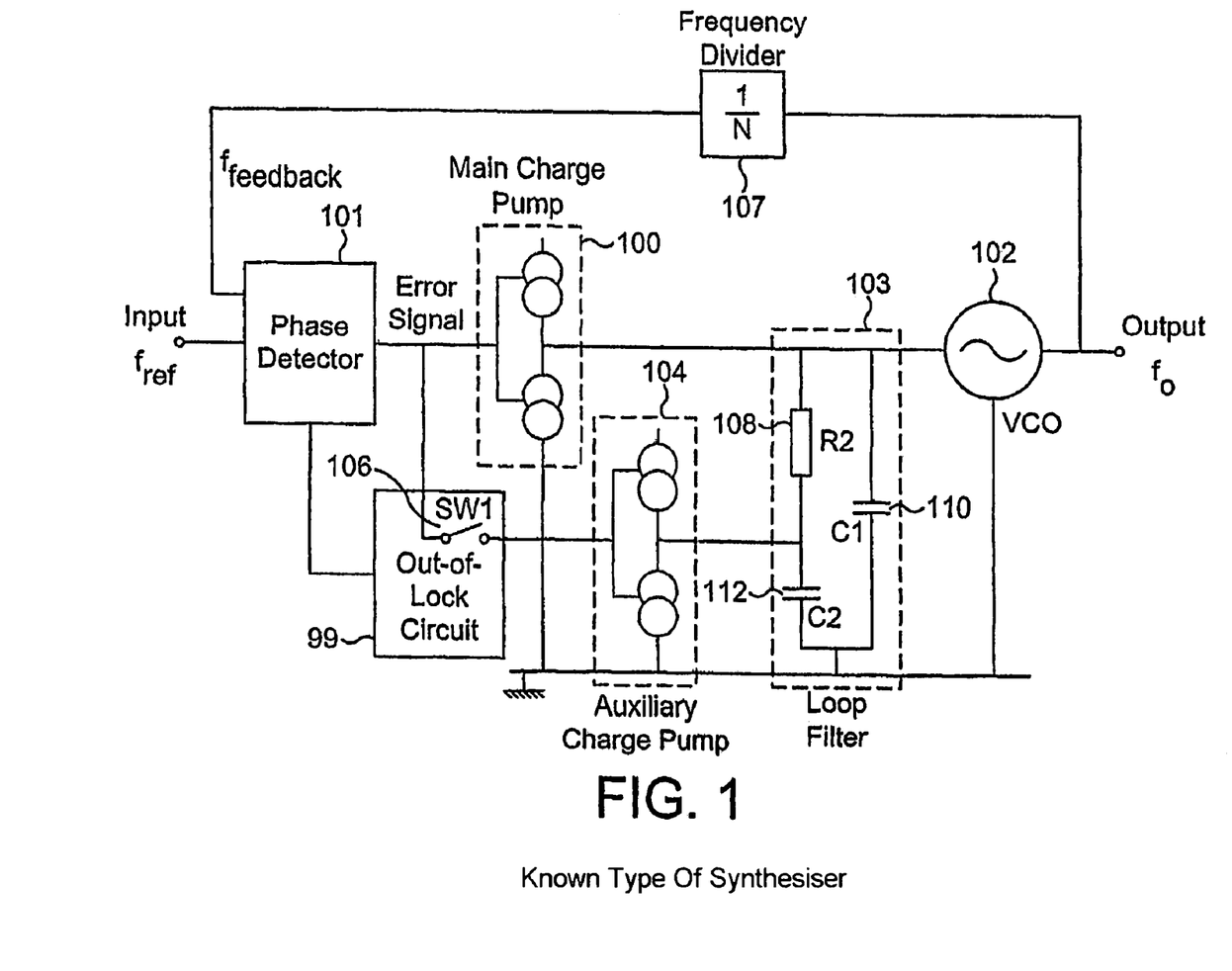
FIG. 1 shows a known synthesizer with an aided acquisition circuit.

Reference is made to FIG. 1, which shows one example of part of a known phase locked loop type of synthesizer containing an aided acquisition circuit. The synthesizer receives a reference signal $f_{ref}$. The reference signal $f_{ref}$ is input to a phase detector 101. The phase detector 101 compares the reference frequency $f_{ref}$ with a feedback value $f_{feedback}$. The phase detector 101 generates an error signal based on the results of this comparison. The output of the phase detector 101 is connected to a charge pump 100. In addition, the phase detector is connected to an out-of-lock circuit 99, which detects or is instructed to pass this error signal, to an additional charge pump 104, whose output is input to a filter 103. The filter 103 comprises a resistor 108 arranged in series with a capacitor 112 between the output of the phase detector and ground. The filter also has a second capacitor 110 which is arranged in parallel to the resistor 108 and capacitor 112 combination. The auxiliary charge pump 104 is connected to a node between the first capacitor 112 and the resistor 108. The filter 103 is connected between the output of the phase detector 101 and the input to a voltage controlled oscillator 102. The desired frequency $f_o$ is output by the voltage controlled oscillator. This frequency is also fed back via a divider 107, the output of which provides $f_{feedback}$.

The filter 103 removes higher order frequencies and in arrangements such as shown in FIG. 1 provides a conversion gain. It should be appreciated that the output frequency provided by the voltage controlled oscillator 102 is determined by the combination of the voltage and the closed loop error signal necessary to maintain phase lock, applied to its input.

When the phase has been acquired and the loop is locked, a switch 106 of the out of lock circuit 99 is open. However, when the phase is being acquired, the switch 106 is closed. This allows the auxiliary charge pump to ensure that the capacitors 110 and 112 have the required amount of charge on them for the required phase.

Arrangements such as shown in FIG. 1 attempt to reduce the phase lock times by speeding up the rate of change of charge held on capacitor 112 during the reacquisition period. This helps maintain the in-band phase noise by maintaining the same locked loop bandwidth. During the acquisition period a larger loop bandwidth is temporarily created to speed up the locking process. Normally increasing the loop bandwidth increases the overall noise content of the synthesizer as the original noise present inside the loop band width is amplified up to the new loop bandwidth. By temporarily using larger loop bandwidths during the acquisition period, it is possible to establish the conditions necessary for faster lock times.

However, state-of-the-art single loop synthesizers are not able to simultaneously meet the specifications of lock time and phase noise required by modern mobile communications systems without assistance. In the arrangement shown in FIG. 1, some additional assistance is provided by the auxiliary charge pump, but these synthesizers still remain inadequate to simultaneously meet the synthesizer lock time and phase noise specifications. This is because of the noise floor limitation of the phase detector. In most modern phase lock loop applications the noise attributed to the sampling action of wide band noise, taking place at the phase frequency detector input, prevails which is amplified up to the loop's operating bandwidth. Usually, the reference signal noise is below that of the sampled noise.

The auxiliary charge pump in the arrangement shown in FIG. 1 complements the charge pump circuit by boosting the rate of change of charge in the loop filter capacitors only when required, leaving the task of maintaining phase lock to the main charge pump. The auxiliary charge pump system must possess hysteresis in order to provide a seamless handover for phase acquisition and must remain unconditionally stable at all times with a minimum of change in loop dynamics during operation and handover. The auxiliary charge pump is arranged to alter the charge in the loop filter capacitors by providing the DC voltage offset necessary to maintain frequency lock which is then adjusted to maintain phase lock at every sampling instance of the digital phase locked loop.

However, this is disadvantageous because during the handback process to normal phase lock, the charge differences between loop filter capacitors results in a phase disturbance of the loop. This parasitic phase disturbance then needs to be compensated for with the normal operating loop bandwidth. This leads to an extended lock time period. Furthermore, the type and quality of the capacitors used in a loop filter can be a limiting factor particularly for lower loop bandwidths. This is particularly true for physically small components, which cannot be fabricated using low loss dielectrics such as C0G or NP0. This may lead to a "dielectric absorption/relaxation" effect, which considerably extends the lock time. The dielectric absorption/relaxation effect is used to describe the apparent memory that poorer quality dielectric capacitors appear to exhibit. This apparent memory effect prohibits these components from being used in any applications where a fast change in capacitor charge is required. Clearly, if the charge on the capacitor cannot be changed rapidly, then the time required to attain phase lock will be increased.

In summary, the problem with known synthesizers is that they all rely on forcing the charge onto the loop filter capacitors to reach their new target level as quickly as possible. This new level of charge in each of the loop filter capacitors combine to give a voltage output which is applied to the voltage controlled oscillator necessary for it to give out the required frequency within the limits of the loop bandwidth. Once this correct voltage level has been reached, the charge forcing circuit (i.e. the auxiliary charge pump) is usually removed or minimised by the action of the switch. This allows the normal action of the phase lock looped dose loop response to acquire and maintain phase lock by applying small correction signals. However, these charge forcing circuits introduce a phase perturbation during the handover process between charge force action to normal phase lock period. Clearly this is undesirable.

SUMMARY OF THE INVENTION

It is an aim of embodiments of the present invention to address one or more of the problems of the known arrangements.

According to one aspect of the present invention, there is provided a synthesizer comprising a detector for detecting a parameter difference, a voltage controlled oscillator, at least one capacitor having one end connected to a node between said detector and said voltage controlled oscillator, means connected to an other end of said at least one capacitor for providing an electrical response in dependence on the detected parameter difference.

According to a second aspect of the present invention, there is provided a method for synthesizing comprising detecting a parameter difference, providing at least one capacitor having one end connected to a node between said detector and a voltage controlled oscillator; and providing an electrical response to an other end of said at least one capacitor in dependence on the detected parameter difference.

BRIEF DESCRIPTION OF DRAWINGS

For a better understanding of the present invention and as to how the same may be carried into effect reference will now be made by way of example to the accompanying drawings in which.

DETAILED DESCRIPTION OF EMBODIMENTS OF THE PRESENT INVENTION

Figure 2:
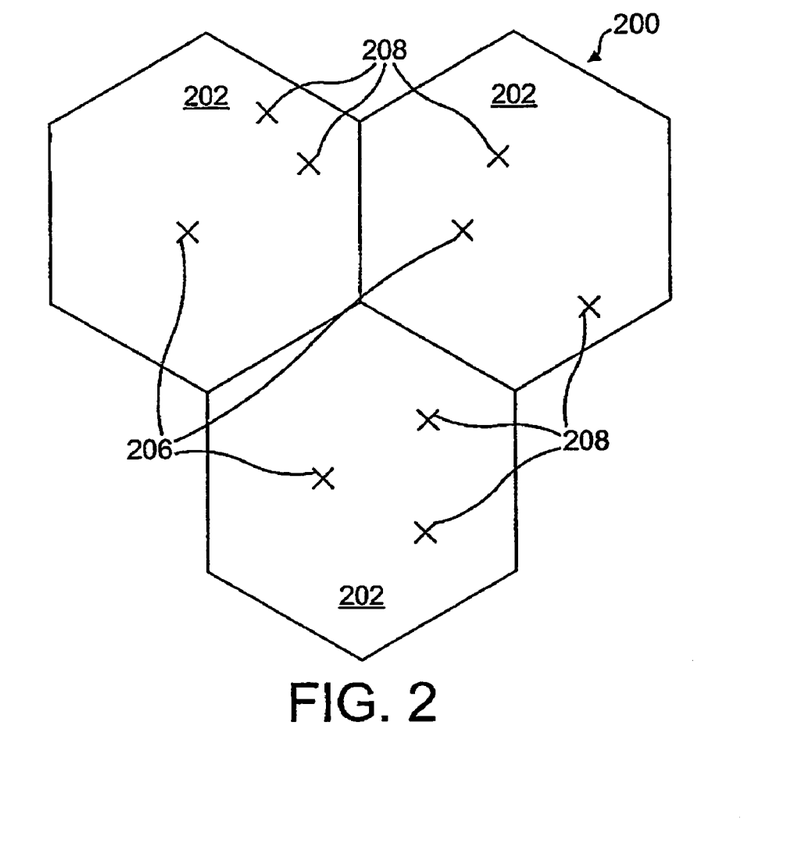
FIG. 2 shows a schematic view of a typical wireless cellular telecommunications network.

Reference is made to FIG. 2, which shows a known cellular telecommunications network in which embodiments of the present invention may be used. The area covered by the network 200 is divided into a plurality of cells 202. Each cell 202 is served by a base transceiver station 206 which is arranged to transmit signals to and receive signals from terminals 208 located in the cell 202 associated with the respective base transceiver station 206. The terminals 208 may be mobile stations, user equipment or the like, which are able to move between the cells.

Each base transceiver station is, in the GSM standard, arranged to receive and transmit on a different number of frequencies. This is because the GSM standard uses a time division multiple access technique. It should be appreciated that embodiments of the present invention can be applied to other telecommunication standards, for example PMR, WCDMA, CDMA, EDGE, DECT. This invention could be used in either the base station or the handset or both, for example in a GSM type network.

Figure 3:
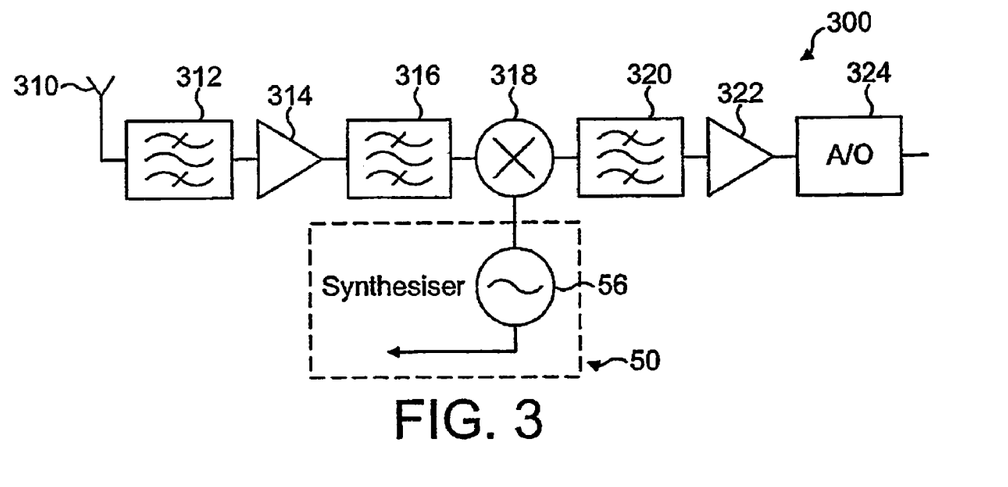
FIG. 3 shows a base transceiver station including a synthesizer embodying the present invention.

Reference is made to FIG. 3, which shows part of the typical base transceiver station 300. In this FIG. 3, only the receive part of the transceiver station 300 is shown. The base transceiver station 300 has an antenna 310, which is arranged to receive signals from mobile stations in the cell served by the base transceiver station 208. Depending on the construction of the base transceiver station, the receive part such as shown in FIG. 3 may be provided for each channel or frequency which is received by the base transceiver station 300 at the same time. Only one receive part is in fact shown in FIG. 3. It should be appreciated that more complex arrangements may be used in which a single receive part is able to receive more than one or all of the frequencies at the same time.

This generic receive part has a first band pass filter 312 which is arranged to filter out signals which fall outside the receive band in which the available channels are located. The filtered output is input to a first low noise amplifier 314, which amplifies the received signals. The amplified signal is then passed through a second band pass filter 316 which filters out any noise, such as harmonics or the like, produced by the first amplifier 314. The output of the second band pass filter 316 is connected to a mixer 318 which receives the output of a voltage controlled oscillator. This voltage controlled oscillator is part of the synthesizer which is described in more detail hereinafter.

The mixer mixes the output of the voltage controlled oscillator with the output of the second band pass filter 316 to provide a down converted signal. That down converted signal may be at the intermediate frequency or the base band frequency, depending on the construction of the received part. The output of the mixer is connected to the input of a third band pass filter 320 which acts as the intermediate frequency filter providing narrow band filtering of the signal. The output of the band pass filter 320 is input to a second amplifier 322, which amplifies the signal. The amplified output of the second amplifier 322 is converted to a digital signal by an analogue to digital converter 324.

It should be appreciated that some receivers may use single or multiple conversions with single or multiple synthesizers.

The base receiver station will have a transmit path, similar to that shown in FIG. 3. In particular there will be up conversion of signal from the base band frequency either directly to the radio frequency or to the intermediate frequency. For either or both of these conversions, the synthesizers which are described in more detail hereinafter will be used to generate the mixing frequency which is input to the respective mixer.

In GSM, frequency hopping is sometimes used. This means that the frequency of a channel, which is used, changes over time. In alternative embodiments of the present invention, the frequency of the given channel may be unchanged. Accordingly, the frequency provided by a given voltage controlled oscillator in the latter circumstances would be unchanged.

Figure 4:
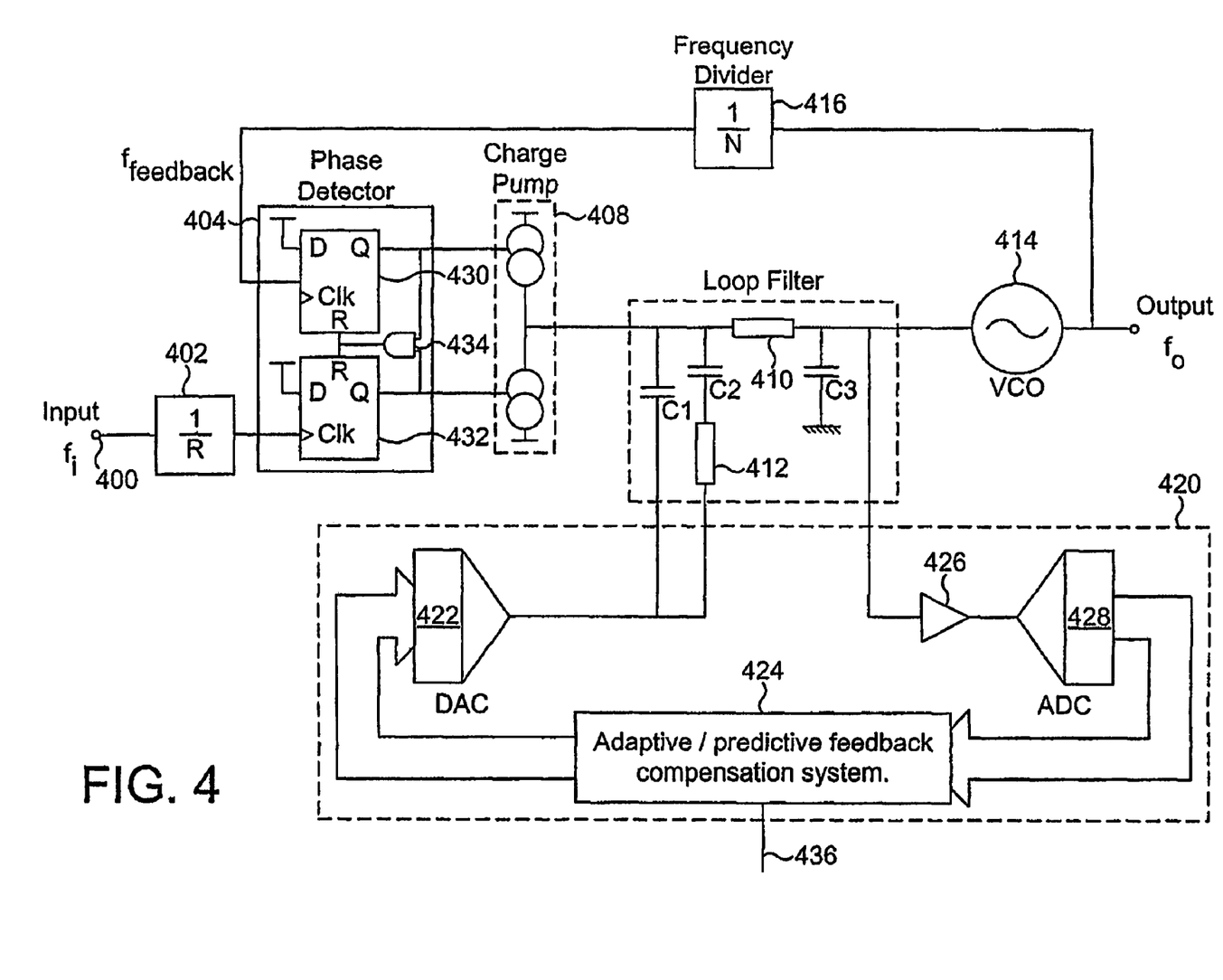
FIG. 4 shows a first synthesizer embodying the present invention.

Reference is made now to FIG. 4, which shows a first embodiment of the invention. The synthesizer comprises an input 400, which receives the input frequency $f_r$. The frequency is input to a first frequency divider 402 which divides the frequency by a factor R where R is the value necessary to give the phase comparison frequency used by a phase detector 404. In particular, the output of the first frequency divider 402 is input to a phase detector 404.

Phase detectors are well known in the art and can have any suitable construction. In the embodiment shown In FIG. 4, the phase detector comprises first and second flip-flops 430 and 432. The first flip-flop 430 has a clock signal input from a second frequency divider 416 whilst second flip-flop 432 has an input from the first frequency divider 402. The Q output of the first flip-flop 430 controls the first part of a charge pump 408 and the Q output of the second flip-flop 432 controls a second part of the charge pump 408. The Q outputs are also connected to AND gate 434. The AND gate 434 has an output connected to the reset inputs of the first and second flip-flops.

As mentioned, the output of the phase detector 404 is used to control a charge pump 408. The charge pump 408 has an output connected to the junction of a first resistor 410 and capacitors C1 and C2. The arrangement of the capacitors C1 and C2 with a second resistor provides the synthesizer low-pass filter. In this arrangement, the first capacitor C1 is arranged with the second capacitor C2 that is in series with the second resistor 412. It should be appreciated that other loop filter component topologies provide the same functionality and could alternatively be used.

The output of the first resistor 410 is connected to the input of a voltage control oscillator 414. The output of the resistor 410 is also connected to ground via a third capacitor C3.

The output of the voltage controlled oscillator 414 provides the output frequency $f_o$. The output of the voltage controlled oscillator is fed back to the second frequency divider 416 which divides the frequency by N or a frequency conversion system. The output of the second frequency divider 416 is input to the phase detector as described earlier.

In contrast to the arrangement shown in FIG. 1, the loop filter does not have one end connected to ground (with the exception of the third capacitor as discussed above). Rather, the end of the loop filter is held at an offset voltage or reference voltage, which is generated by the arrangement indicated by reference numeral 420. The arrangement 420 may be provided on an Integrated circuit. It should be appreciated that the arrangement 420 can be simply added onto known phase locked loops without requiring modification to the phase locked loop circuitry.

In this arrangement 420, between the node connecting resistor 410 and the third capacitor C3, and the voltage controlled oscillator 414 is an output, which is connected to an amplifier 426. The output of the amplifier 426 is input to an analogue to digital converter 428. The amplifier 426 also provides isolation between the analogue to digital converter and is optional. The output of the analogue to digital converter 428 provides an output to an adaptive/predictive feedback compensation system 424. In practice, the adaptive/predictive feedback compensation system 424 will comprise a look-up table, algorithm or similar. In this embodiment, an optional disable output 436 is provided from the adaptive/predictive feedback compensation system to the phase detector 404. This output disables the phase detector during the settling transient of the circuitry 420.

A further output of the adaptive/predictive feedback compensation system is input to a digital to analogue converter 422. The output of the converter is a voltage, offset from ground.

Thus, in contrast to the known arrangements, the phase detector 404 and the loop associated with that detector is arranged to maintain phase lock but the DC voltage level is not referenced to ground. Instead, the reference voltage level is offset to emulate the charge normally stored on the loop filter capacitors. The term "reference voltage" is used to describe the mean voltage applied to the VCO input, necessary to force the VCO output frequency close to the target value required for the given or/current phase lock loop frequency settings. This reference voltage level is driven by the arrangement referenced 420.

In operation, the reference voltage is changed at the moment that the phase lock loop is required to change frequency. Thereafter, the new voltage level is held constant. The constant voltage offset replaces the charge held in the loop filter capacitors that are normally used to provide the mean DC level offset relative to the ground. It should be appreciated that this new reference voltage could be of either polarity depending upon the input tuning range of the voltage controlled oscillator employed.

Changing the reference voltage instead of changing the charge in the loop filter capacitors gives the same effect but importantly does not degrade the phase noise performance of the phase lock loop. To ensure phase lock, the dynamics of the locked phase lock loop are not dependent on individual charge stored on the respective loop filter capacitors but only on the incremental changes in charge necessary to overcome the noise introduced by the noise components within the phase lock loop.

Without any additional filtering in the loop filter, any noise introduced by the digital circuit elements used to maintain this voltage reference will undergo high pass filtering into the overall phase lock loop noise profile and will not degrade the in-band phase noise. The resistor capacitor ladder network provided by the capacitor C3 and resistor 410 in cascade with the loop filter configuration, limits this high-pass response.

The disable-signal provided by the adaptive/predictive feedback compensation system 424 allows the temporary disablement of the phase detector circuits. This is because the settling transient of the voltage reference circuit will introduce a disturbance within the closed loop system, which the phase frequency detector may counteract potentially extending the lock time. To avoid this, during the transient period the phase detector is disabled and synchronously re-enabled to provide optimum results.

Embodiments of the invention are able to remove the need for a handover process between the charge-force action to the normal phase lock loop aided acquisition schemes, by not changing the charge within the loop filter capacitors necessary to maintain the voltage reference. Rather, the use of the digital to analogue converter to provide and continually maintain the voltage reference for each frequency output required of the synthesizer is used. This contrasts with the known arrangements where all loop filter components are referenced to ground voltage, to which they are connected, requiring them to hold a voltage difference giving the required reference voltage. However, in embodiments of the present invention, this ground voltage is instead replaced by the digital to analogue converter whose output represents the reference voltage. This means that the loop filter capacitors are no longer required to hold the charge necessary to maintain this voltage relative to the ground voltage. This leaves the loop filter capacitors the simpler task of maintaining the small transient charge references necessary to maintain phase lock and to absorb any small digital to analogue converter, output voltage inaccuracies.

Embodiments of the present invention are such that the correction signal is applied as a voltage to the loop filter cold end (i.e. that end of the loop filter connected to ground) rather than the hot end (that is the end connected to the charge pump). Significantly, as there is only a minimal change in charge held on the loop filter capacitors, the adverse effects of dielectric relaxation/absorption are avoided. This is particularly important when considering dosed loop systems with small "N" division feedback values that is where the second frequency divider 416 has a small value of N or low loop bandwidth, both requiring large loop filter capacitor values. Large capacitors with low loss dielectrics are not currently available especially in surface mount.

Furthermore, embodiments of the present invention reduce the risk of cycle slipping in a digital phase-frequency detector by limiting the transient applied to the phase frequency to within its linear operating range. Cycle slipping occurs when the rate of change in the feedback signal exceeds the maximum linear phase detection range of the phase frequency detector. In other words, when there is a big difference between the output of the VCO and the reference frequency, one or more cycles may be lost.

Each time the phase-frequency slips a cycle, the lock time period effectively increases.

The further advantage of embodiments of the present invention is the reduced overshoot experienced by the phase lock loop during its transient period. The worst case overshoot occurs when the phase lock loop is requested to jump between its two operating extremes, causing a large overshoot to occur which must not force the charge pump beyond its linear range of operation. With the currently proposed synthesizers, if the maximum effective, (across the loop filter), charge pump output voltage is in the range X to Y volts, then the normal VCO input to output characteristics can be adjusted to accept an input Voltage range of X to Y. With an increase of the applied voltage input range, the gain of the VCO can reduced. A reduced VCO gain range is understood to potentially offer better phase noise performance and loop filter component values. The equivalent VCO operating range required with the known synthesizers is very much smaller than with the synthesizers embodying the invention.

Thus, embodiments of the present invention allow the lock time of the phase lock loop to be considerably reduced, especially for large frequency changes. Although the phase lock loop during this digital to analogue converter settling process might introduce a limited number of correction pulses, depending on the loop configuration, there is no handover process between frequency to phase acquisition, therefore the overall settling time is much reduced. The percentage decrease in the locking period is related both to the loop bandwidth and sampling frequency and the phase detector for a given loop configuration.

Figure 5:
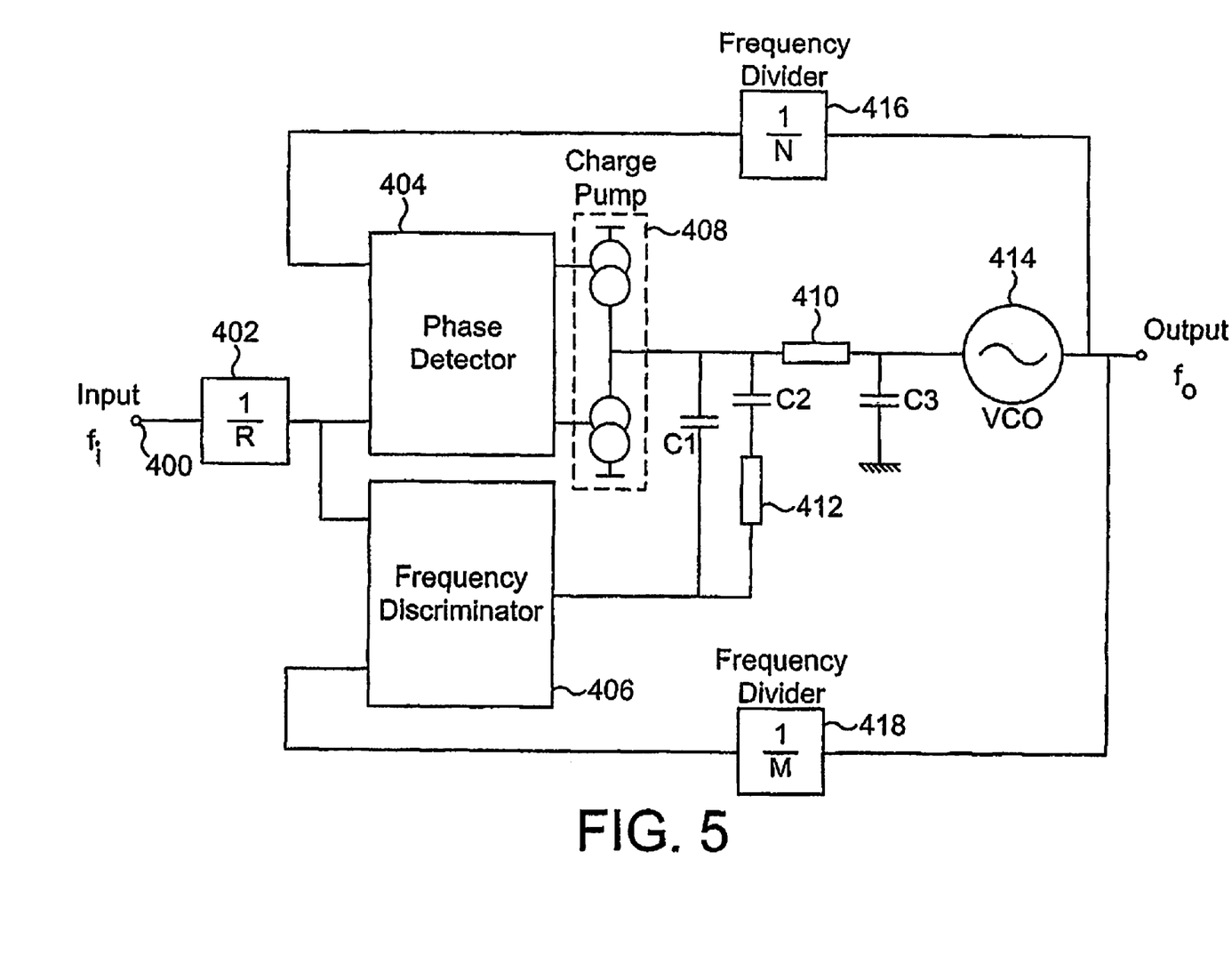
FIG. 5 shows a second synthesizer embodying the present invention.

Reference is made to FIG. 5 which shows a second arrangement embodying the present invention. Those elements of the synthesizer, which are the same as shown in FIG. 4, are referred to by the same reference numbers. The arrangement shown in FIG. 5 is similar to the arrangement shown In FIG. 4. In particular, the output of the VCO 414 is fed back to the input of a frequency discriminator 406, which also receives the output of the frequency divider 402.

The frequency discriminator of FIG. 5 is arranged to compare the input frequency from the frequency divider 402 with the frequency from the output of the VCO. The frequency discriminator 406 is arranged to provide a mean voltage setting the VCO output to the mean target frequency. Thus, the phase detector is concerned with the phase and the frequency discriminator is concerned with the frequency.

In embodiments of the present invention, the frequency acquisition circuit can be an all digital adaptive system employing a digital to analogue and analogue to digital conversion device capable of compensating for any changes in temperature, climate, manufacturing tolerances and other voltage control oscillator gain variations.

The phase lock loop function can be designed and optimised independently from the frequency acquisition system. The summation of the two systems is across the loop filter components. The phase lock loop function is a current injection to the loop filter whilst the frequency acquisition is a voltage injection, with both quantities being summed across the loop filter. In preferred embodiments of the present invention the loop filter acts as a filter and not as a voltage offset. Ideally, only the phase noise offset charge is held within the loop filter components, however, there may be a small offset attributed to analogue variations within the compensation circuit. It should be appreciated that no change in the standard charge pump driven loop filter configuration is necessary because the only change is the ground connection being replaced with a voltage offset source.

Figure 7:
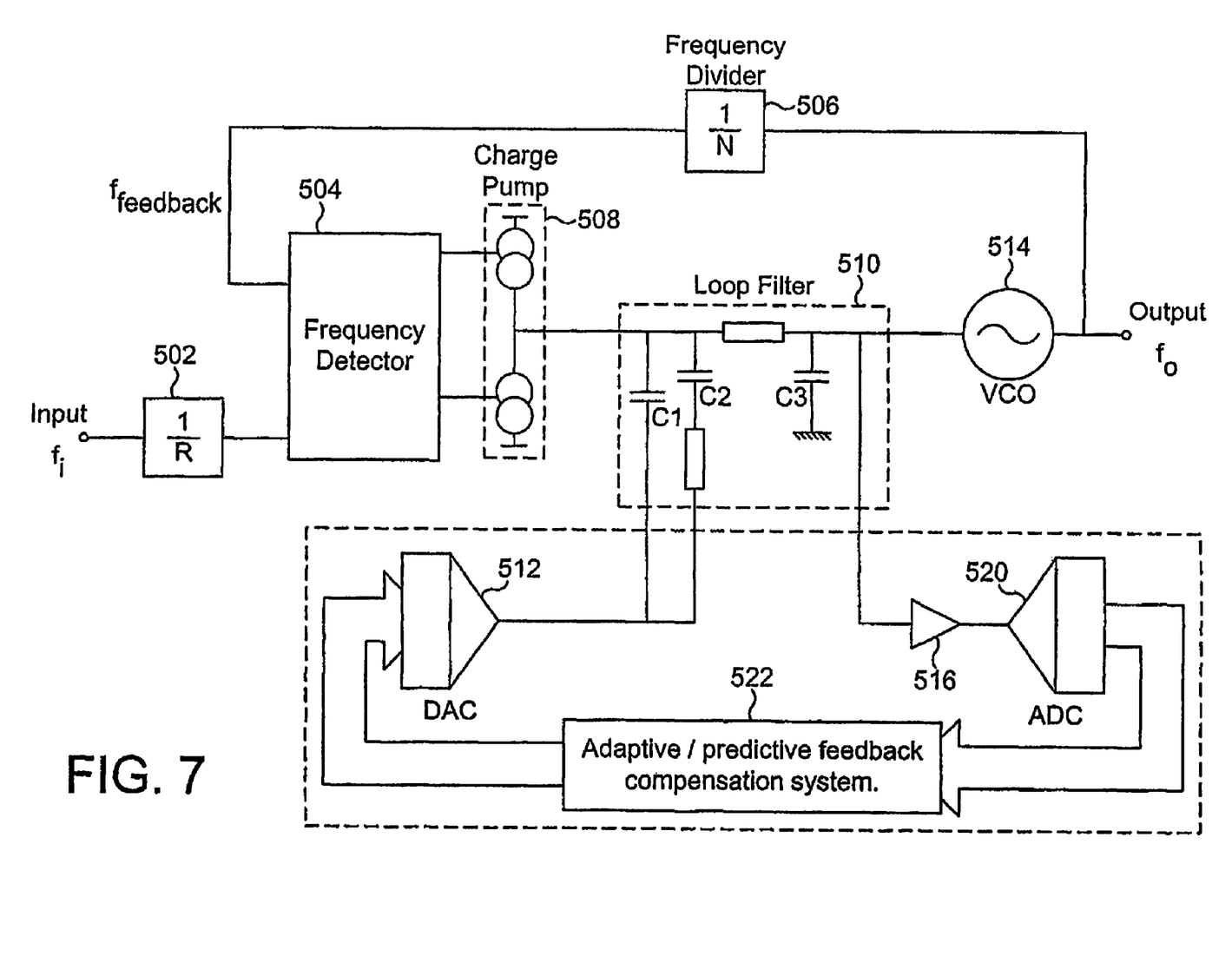
FIG. 7 shows a third synthesizer embodying the present invention.

Reference is made to FIG. 7 which shows an alternative embodiment of the present invention. In this arrangement, the synthesizer acts as a frequency locked loop. This contrasts with the embodiments shown in FIGS. 4 and 5, which are phase locked loops. The frequency $f_i$ is input to the first divider 502, which divides the frequency, by a factor of R. The output of the first divider 502 is input to a frequency discriminator 504. The frequency discriminator has a second input from a second frequency divider 506. The output of the frequency discriminator is connected to the input of a charge pump 508. The output of the charge pump 508 is input to a filter 510. The filter 510 can have the same structure as the filter of FIGS. 4 and 5. The filter 510 has a control input provided by the digital to analogue converter 512. The output of the digital to analogue converter 512 provides the reference voltage in the same way as described in relation to the earlier embodiments. The output of the filter is connected to the voltage controlled oscillator 514. The output of the voltage controlled oscillator provides the output frequency $f_o$ and the output which is fed back to the second frequency divider 506. There is also provided an optional isolation amplifier 516 which receives an input from a node between an output of the filter 510 and the voltage controlled oscillator 514. The output of the amplifier 516 is provided to the input of an analogue to digital converter 520. The output of the analogue to digital converter 520 is input to a adaptive/predictive feedback compensation system 522 comprising a look-up table, algorithm or the like, the output of which controls the digital to analogue converter 512. The arrangement shown in FIG. 7 operates in a similar way to the arrangement shown in FIG. 4 with the frequency discriminator, 504 accounting for any variations within the loop. These variations could be due to one or more of device variations caused by changes in temperature, climate, manufacturing tolerances and other voltage control oscillator gain variations.

Figure 6A:
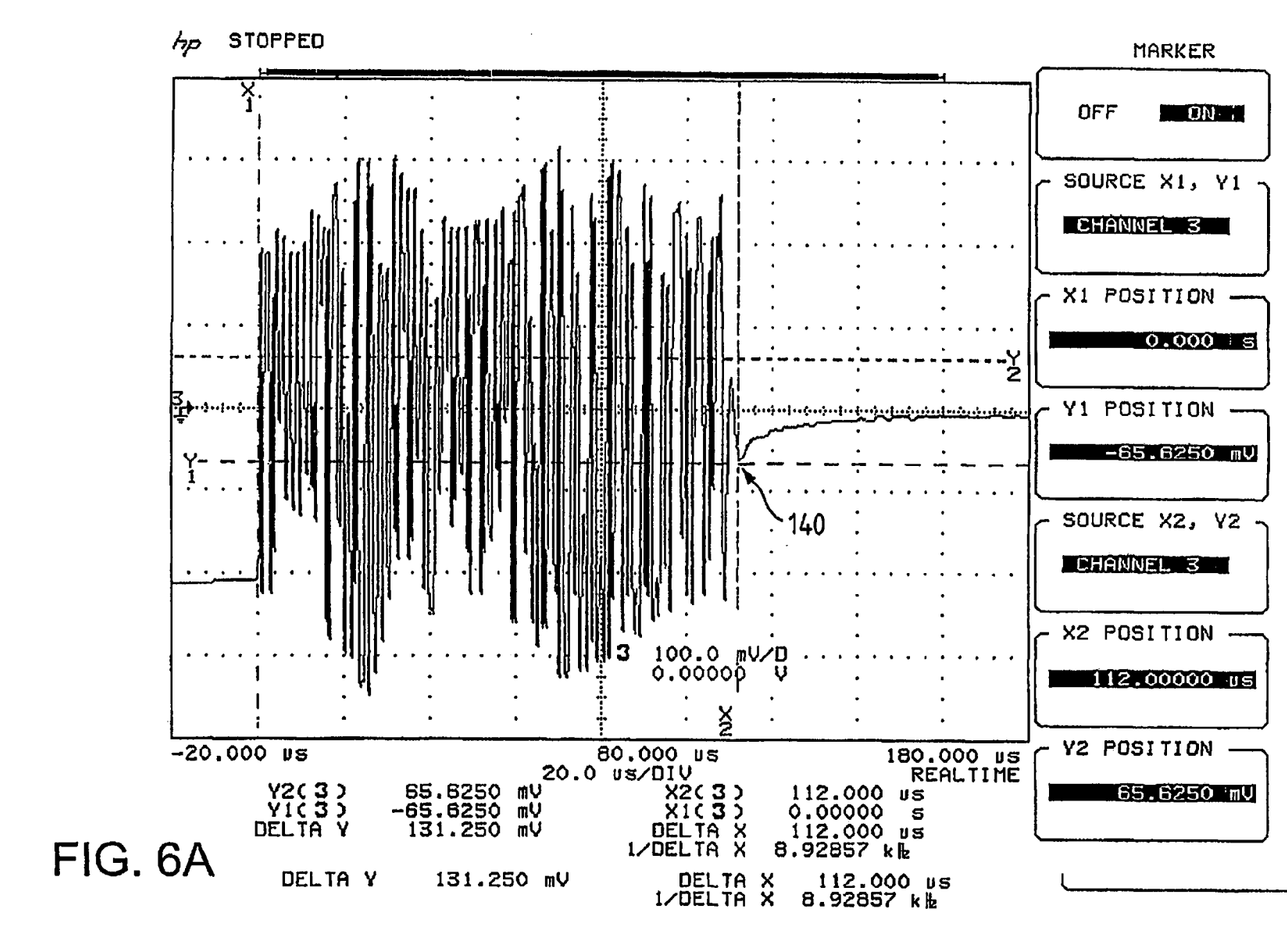
FIG. 6A shows a measured result using a synthesizer not embodying the present invention.
Figure 6B:
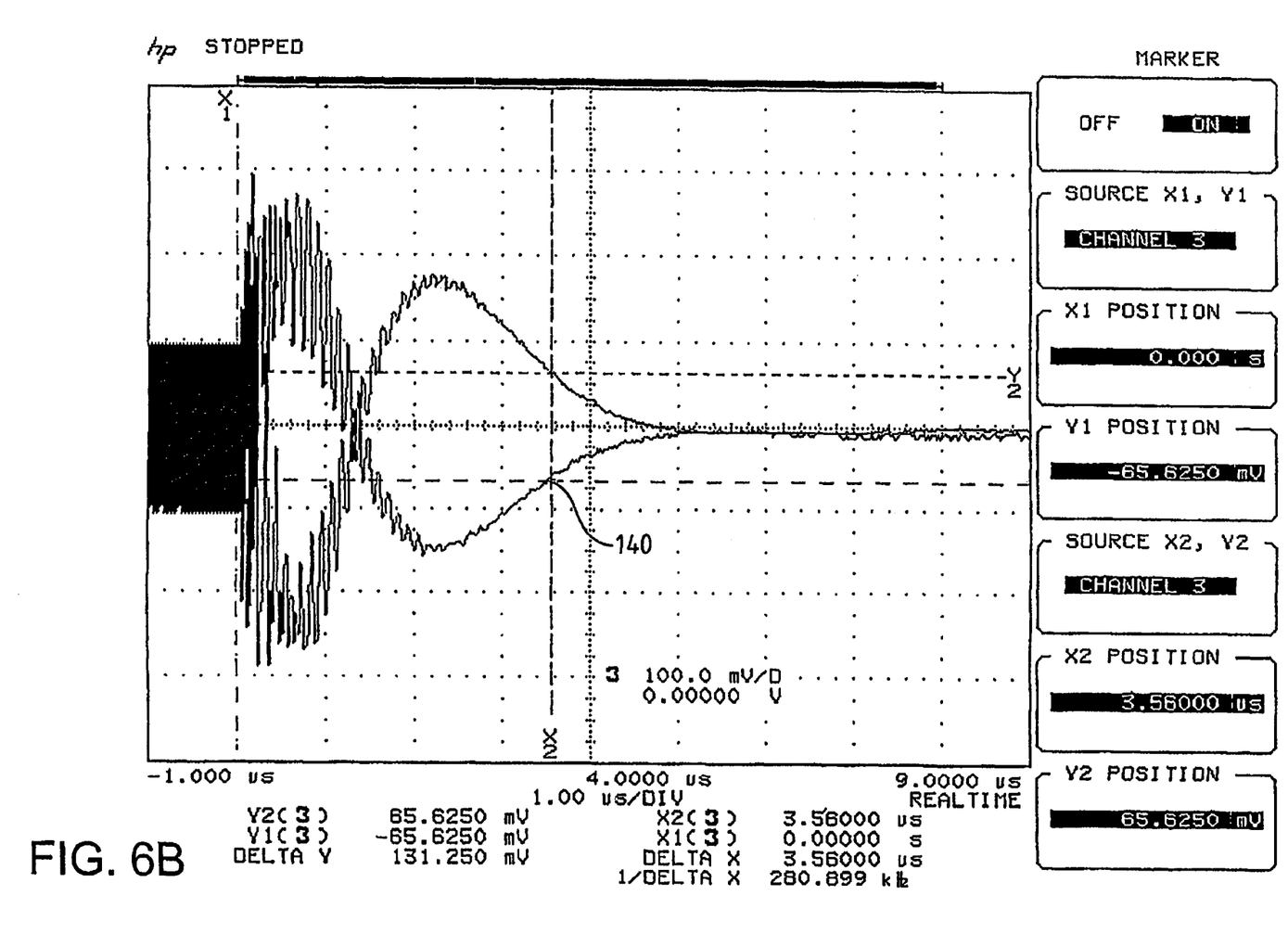
FIG. 6B shows a measured result using a synthesizer, (with the same operational set up as for FIG. 6A), embodying the present invention.

Reference is made to FIG. 6A, which shows the time taken to reach a specified phase lock criteria of less than 6 degrees phase error, in the phase transient. In particular, a voltage representing the demodulated phase transient is plotted against time. As can be seen, the phase lock loop reaches locking point 140 at roughly 112 microseconds. Contrast this with FIG. 6B which shows that the locking point is reached after 3.56 microseconds. As can be seen, embodiments of the present invention provide a much-improved performance as compared to those arrangements, which do not make use of the present invention.

Embodiments of the present invention thus allow the functions of phase lock and frequency acquisition circuits to be separately managed and optimised without mutual degradation or disturbing the noise performance of the phase lock loop.

The combined tri-state phase-frequency detector system of the prior art can be replaced with separate phase detector and frequency acquisition systems. Accordingly, the sampled digital noise floor limitations of the tri-state phase frequency detector, which all fractional-N systems seek to overcome, could be replaced with a lower noise phase detector such as an analogue mixer with a current output circuit. The considerably lower noise of a mixer phase detector in turn allows the loop bandwidth of the phase lock loop to be increased without degradation, further improving the lock time performance.

In preferred embodiments of the present invention, the phase detector could be a separate analogue mixer, a Gilbert cell integrated mixer or an XOR gate whilst the frequency detector may be a simple digital device or an intelligent voltage predictive system that can be integrated in a synthesizer chip.

Hand-over from frequency to phase acquisition may be seamless because the frequency step only occurs at the point when the synthesizer is asked to change frequency.

The additional reference voltage circuitry can be used to modulate the phase lock loop or can be used to add back compensation, for example, in fractional-N synthesis.

The synthesizer described here is applicable to an integer-n, fractional-n, mixer based synthesizer or hybrid of these techniques as well as any other type of synthesizer. The feedback path could be mix, divide or a combination of these techniques. There are some synthesizers, which do not rely on down-conversion techniques in the feedback path, instead they deliberately create high energy harmonic combs, where a single harmonic "tooth" of this comb is mixed with the VCO signal, which could equally benefit from the application of this invention.

The filter arrangement shown in embodiments of the present invention is a type 2, second order loop filter. It should be appreciated that embodiments of the present invention are applicable to other suitable types and topologies of filter such as type 1, second-order loop filters or the like.

The phase detector may in some embodiments of the invention be replaced by a mixer that has a current output circuit. This may provide an improved noise performance. The output of the phase detector may provide a pulsed or continuous current.

The first capacitor C1 typically have a size which is between 1/10 and 1/6 of the size of the second capacitor C2.

It should be appreciated that although preferred embodiments of the present invention have been described as being suitable for application in GSM systems, embodiments of the present invention have a very wide application. Not only can synthesizers embodying the present invention be used in any other telecommunication application as required, but also in any other field unrelated to telecommunications. Synthesizers are widely used and embodiments of the invention can be used wherever required.

The term synthesizer is intended to be a generic term to cover a multitude of different signal generation techniques, which are locked in some way to a reference source. The synthesisers can be phase locked, frequency locked or locked to any other suitable parameter.

The invention claimed is:

1. A synthesizer comprising:
   at least one detector for detecting a parameter difference;
   a voltage controlled oscillator;
   at least one first capacitor having one end connected to a node between said at least one detector and said voltage controlled oscillator;
   at least one second capacitor having one end connected to a node between said at least one detector and said voltage controlled oscillator and another end connected to ground;
   means connected to another end of said at least one first capacitor for providing an electrical response in dependence on the detected parameter difference,
   wherein said response means comprises a digital to analogue converter.

2. A synthesizer comprising:
   at least one detector for detecting a parameter difference;
   a voltage controlled oscillator;
   at least one first capacitor having one end connected to a node between said at least one detector and said voltage controlled oscillator;
   at least one second capacitor having one end connected to a node between said at least one detector and said voltage controlled oscillator and another end connected to ground;
   means connected to another end of said at least one first capacitor for providing an electrical response in dependence on the detected parameter difference,
   wherein said response means comprises compensation means, and wherein said compensation means comprises a look up table.

3. A synthesizer comprising:
   at least one detector for detecting a parameter difference;
   a voltage controlled oscillator;
   at least one first capacitor having one end connected to a node between said at least one detector and said voltage controlled oscillator;
   at least one second capacitor having one end connected to a node between said at least one detector and said voltage controlled oscillator and another end connected to ground;
   means connected to another end of said at least one first capacitor for providing an electrical response in dependence on the detected parameter difference,
   wherein said response means comprises feedback compensation means and a digital to analogue converter, and wherein said compensation means is arranged to control said digital to analogue converter.

4. A synthesizer comprising:
   at least one detector for detecting a parameter difference;
   a voltage controlled oscillator;
   at least one first capacitor having one end connected to a node between said at least one detector and said voltage controlled oscillator;
   at least one second capacitor having one end connected to a node between said at least one detector and said voltage controlled oscillator and another end connected to ground;
   means connected to another end of said at least one first capacitor for providing an electrical response in dependence on the detected parameter difference,
   wherein said response means has an input from a node between said at least one first capacitor and said voltage controlled oscillator.

5. A synthesizer comprising:
   at least one detector for detecting a parameter difference;
   a voltage controlled oscillator;
   at least one first capacitor having one end connected to a node between said at least one detector and said voltage controlled oscillator;
   at least one second capacitor having one end connected to a node between said at least one detector and said voltage controlled oscillator and another end connected to ground;
   means connected to another end of said at least one first capacitor for providing an electrical response in dependence on the detected parameter difference,
   wherein said response means has an input connected to an analogue to digital converter.

6. The synthesizer of claim 1, embodied at least partially in an integrated circuit.

7. The synthesizer of claim 1, where said at least one detector comprises a phase detector.

8. The synthesizer of claim 1, where said at least one detector comprises a frequency detector.

9. The synthesizer of claim 1, where a voltage that is offset from ground is applied at the another end of said at least one first capacitor, said voltage having a value that forces an output frequency of the voltage controlled oscillator to be close to a target output frequency.

10. The synthesizer of claim 1, embodied as part of an apparatus configured for cellular communication.

11. The synthesizer of claim 1, further comprising at least one additional capacitor in parallel with said at least one first capacitor.

12. The synthesizer of claim 2, embodied at least partially in an integrated circuit.

13. The synthesizer of claim 2, where said at least one detector comprises a phase detector.

14. The synthesizer of claim 2, where said at least one detector comprises a frequency detector.

15. The synthesizer of claim 2, where a voltage that is offset from ground is applied at the another end of said at least one first capacitor, said voltage having a value that forces an output, frequency of the voltage controlled oscillator to be close to a target output frequency.

16. The synthesizer of claim 2, embodied as part of an apparatus configured for cellular communication.

17. The synthesizer of claim 2, further comprising at least one additional capacitor in parallel with said at least one first capacitor.

18. The synthesizer of claim 3, embodied at least partially in an integrated circuit.

19. The synthesizer of claim 3, where said at least one detector comprises a phase detector.

20. The synthesizer of claim 3, where said at least one detector comprises a frequency detector.

21. The synthesizer of claim 3, where a voltage that is offset from ground is applied at the another end of said at least one first capacitor, said voltage having a value that forces an output frequency of the voltage controlled oscillator to be close to a target output frequency.

22. The synthesizer of claim 3, embodied as part of an apparatus configured for cellular communication.

23. The synthesizer of claim 3, further comprising at least one additional capacitor in parallel with said at least one first capacitor.

24. The synthesizer of claim 4, embodied at least partially in an integrated circuit.

25. The synthesizer of claim 4, where said at least one detector comprises a phase detector.

26. The synthesizer of claim 4, where said at least one detector comprises a frequency detector.

27. The synthesizer of claim 4, where a voltage that is offset from ground is applied at the another end of said at least one first capacitor, said voltage having a value that forces an output frequency of the voltage controlled oscillator to be close to a target output frequency.

28. The synthesizer of claim 4, embodied as part of an apparatus configured for cellular communication.

29. The synthesizer of claim 4, further comprising at least one additional capacitor in parallel with said at least one first capacitor.

30. The synthesizer of claim 5, embodied at least partially in an integrated circuit.

31. The synthesizer of claim 5, where said at least one detector comprises a phase detector.

32. The synthesizer of claim 5, where said at least one detector comprises a frequency Detector.

33. The synthesizer of claim 5, where a voltage that is offset from ground is applied at the another end of said at least one first capacitor, said voltage having a value that forces an output frequency of the voltage controlled oscillator to be close to a target output frequency.

34. The synthesizer of claim 5, embodied as part of an apparatus configured for cellular communication.

35. The synthesizer of claim 5, further comprising at least one additional capacitor in parallel with said at least one first capacitor.

* * * * *

UNITED STATES PATENT AND TRADEMARK OFFICE
CERTIFICATE OF CORRECTION

PATENT NO. : 7,567,132 B2  Page 1 of 1
APPLICATION NO. : 10/503661
DATED : July 28, 2009
INVENTOR(S) : Thompson It is certified that error appears in the above-identified patent and that said Letters Patent is hereby corrected as shown below:

Claim 27, column 12, line 14, delete "haying" and replace with --having--.

Signed and Sealed this

Thirteenth Day of October, 2009

David J. Kappos
*Director of the United States Patent and Trademark Office*